United States Patent
He

(10) Patent No.: US 10,212,848 B2
(45) Date of Patent: Feb. 19, 2019

(54) ELECTRONIC DEVICES, METHODS, AND PROGRAM PRODUCTS FOR DETERMINING AN ATMOSPHERIC PRESSURE

(71) Applicant: Lenovo (Beijing) Limited, Beijing (CN)

(72) Inventor: Xiao He, Beijing (CN)

(73) Assignee: LENOVO (BEIJING) LIMITED, Beijing (CN)

(*) Notice: Subject to any disclaimer, the term of this patent is extended or adjusted under 35 U.S.C. 154(b) by 0 days.

(21) Appl. No.: 15/471,222

(22) Filed: Mar. 28, 2017

(65) Prior Publication Data

US 2017/0280586 A1    Sep. 28, 2017

(30) Foreign Application Priority Data

Mar. 28, 2016 (CN) .......................... 2016 1 0183577

(51) Int. Cl.
*H05K 7/20* (2006.01)
*G01L 11/00* (2006.01)
*G01C 5/06* (2006.01)
*F04D 27/00* (2006.01)

(52) U.S. Cl.
CPC ....... *H05K 7/20209* (2013.01); *F04D 27/001* (2013.01); *G01C 5/06* (2013.01); *G01L 11/002* (2013.01)

(58) Field of Classification Search
None
See application file for complete search history.

(56) References Cited

U.S. PATENT DOCUMENTS

| 8,355,999 | B2 | 1/2013 | Vaidyanathan et al. |
| 2005/0019164 | A1 | 1/2005 | Delano et al. |
| 2005/0174736 | A1* | 8/2005 | Merlet .............. H02G 3/04 361/695 |
| 2006/0291994 | A1 | 12/2006 | Bok et al. |
| 2008/0055850 | A1* | 3/2008 | Carlson .............. G06F 1/20 361/695 |

(Continued)

FOREIGN PATENT DOCUMENTS

| CN | 102231041 A | 11/2011 |
| CN | 102808796 A | 12/2012 |

(Continued)

*Primary Examiner* — Courtney Smith
(74) *Attorney, Agent, or Firm* — Kunzler Bean & Adamson

(57) ABSTRACT

Devices, methods, and program products for determining an atmospheric pressure are disclosed. One electronic device includes a fan that dissipates heat. The fan rotates at a rotation speed. The electronic device also includes a heat source. The electronic device includes a calculation unit that determines an atmospheric pressure at a location of the electronic device. The electronic device also includes a first temperature sensor that senses an ambient temperature and sends first information corresponding to the ambient temperature to the calculation unit. The electronic device includes a second temperature sensor that senses a temperature of the heat source and sends second information corresponding to the temperature of the heat source to the calculation unit. The calculation unit determines the atmospheric pressure based on the first information, the second information, and the rotation speed of the fan.

20 Claims, 3 Drawing Sheets

(56) References Cited

U.S. PATENT DOCUMENTS

| | | | |
|---|---|---|---|
| 2010/0186517 A1* | 7/2010 | Bean, Jr. | G01F 1/28 |
| | | | 73/726 |
| 2011/0103008 A1 | 5/2011 | Aklilu et al. | |
| 2011/0258157 A1 | 10/2011 | Vaidyanathan et al. | |
| 2012/0298219 A1* | 11/2012 | Bean, Jr. | G01F 1/28 |
| | | | 137/455 |
| 2012/0300391 A1* | 11/2012 | Keisling | H05K 7/20745 |
| | | | 361/679.46 |
| 2012/0318492 A1* | 12/2012 | Keisling | H05K 7/20827 |
| | | | 165/287 |
| 2013/0233532 A1* | 9/2013 | Imwalle | F28F 27/02 |
| | | | 165/287 |
| 2014/0202678 A1* | 7/2014 | Goth | H05K 7/20772 |
| | | | 165/287 |
| 2015/0075764 A1* | 3/2015 | Goth | H05K 7/20772 |
| | | | 165/279 |
| 2015/0195958 A1* | 7/2015 | Keisling | H05K 7/20745 |
| | | | 361/679.47 |
| 2017/0071077 A1* | 3/2017 | Carlson | H05K 7/20827 |
| 2017/0079165 A1* | 3/2017 | Keisling | H05K 7/20745 |

FOREIGN PATENT DOCUMENTS

| | | |
|---|---|---|
| CN | 103983244 A | 8/2014 |
| JP | 2008172118 A | 7/2008 |

* cited by examiner

ELECTRONIC DEVICES, METHODS, AND PROGRAM PRODUCTS FOR DETERMINING AN ATMOSPHERIC PRESSURE

FIELD

The subject matter disclosed herein relates to electronic devices, and specifically to electronic devices, methods, and program products for determining an atmospheric pressure.

BACKGROUND

A fan may be used to control the temperature of an electronic device. The ability of the fan to dissipate heat may vary based on an atmospheric pressure. Therefore, a fan may not operate properly as atmospheric pressure changes if a rotation speed of a fan blade remains constant.

SUMMARY

A method for determining an atmospheric pressure is disclosed. Devices and program products also perform the functions of the method. In one embodiment, an electronic device includes a fan that dissipates heat. In such an embodiment, the fan rotates at a rotation speed. The electronic device also includes a heat source. The electronic device includes a calculation unit that determines an atmospheric pressure at a location of the electronic device. The electronic device also includes a first temperature sensor that senses an ambient temperature and sends first information corresponding to the ambient temperature to the calculation unit. The electronic device includes a second temperature sensor that senses a temperature of the heat source and sends second information corresponding to the temperature of the heat source to the calculation unit. The calculation unit determines the atmospheric pressure based on the first information, the second information, and the rotation speed of the fan.

In some embodiments, the first temperature sensor, the second temperature sensor, and the heat source are located at an air inlet of the fan or an air outlet of the fan. In certain embodiments, the calculation unit determines an altitude of the location of the electronic device based on the atmospheric pressure. In various embodiments, the electronic device includes a fan speed controller that adjusts the rotation speed of the fan based on the ambient temperature and the altitude.

In one embodiment, the heat source is integrated with the second temperature sensor as a constant-power component that outputs the second information. In certain embodiments, the heat source is a constant-power heat source. In some embodiments, determining the atmospheric pressure further includes determining a difference between the ambient temperature and the temperature of the heat source.

One method for determining an atmospheric pressure includes determining an atmospheric pressure at a location of an electronic device. In such an embodiment, the electronic device includes a fan that dissipates heat and a heat source, and the fan rotates at a rotation speed. In some embodiments, the method includes sensing an ambient temperature via a first temperature sensor. In certain embodiments, the method includes sensing a temperature of the heat source via a second temperature sensor. In various embodiments, determining the atmospheric pressure further includes determining the atmospheric pressure based on the ambient temperature, the temperature of the heat source, and the rotation speed of the fan.

In some embodiments, the first temperature sensor, the second temperature sensor, and the heat source are located at an air inlet of the fan or an air outlet of the fan. In certain embodiments, the method includes determining an altitude of the location of the electronic device based on the atmospheric pressure. In various embodiments, the method includes adjusting the rotation speed of the fan based on the ambient temperature and the altitude.

In one embodiment, the heat source is integrated with the second temperature sensor as a constant-power component that outputs information indicating the temperature of the heat source. In certain embodiments, the heat source is a constant-power heat source. In some embodiments, determining the atmospheric pressure further includes determining a difference between the ambient temperature and the temperature of the heat source.

One program product includes a computer readable storage medium that stores code executable by a processor. The executable code includes code to perform determining an atmospheric pressure at a location of an electronic device. In such an embodiment, the electronic device includes a fan that dissipates heat and a heat source, and the fan rotates at a rotation speed. The executable code also includes code to perform sensing an ambient temperature via a first temperature sensor. The executable code includes code to perform sensing a temperature of the heat source via a second temperature sensor. The executable code also includes code to determine the atmospheric pressure based on the ambient temperature, the temperature of the heat source, and the rotation speed of the fan.

In some embodiments, the first temperature sensor, the second temperature sensor, and the heat source are located at an air inlet of the fan or an air outlet of the fan. In certain embodiments, the executable code further includes code to determine an altitude of the location of the electronic device based on the atmospheric pressure. In various embodiments, the executable code further includes code to adjust the rotation speed of the fan based on the ambient temperature and the altitude.

In one embodiment, the heat source is integrated with the second temperature sensor as a constant-power component that outputs information indicating the temperature of the heat source. In certain embodiments, the heat source is a constant-power heat source.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
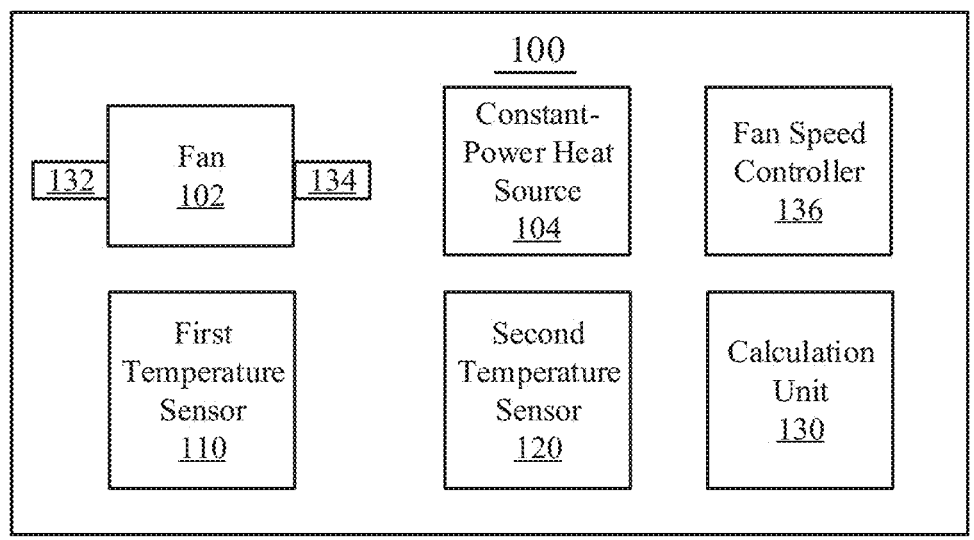
FIG. 1 illustrates a schematic block diagram of an embodiment of an electronic device.

In order to make the objects, technical solutions and advantages of the present disclosure more clear, exemplary embodiments of the present disclosure will be described in detail below referring to the drawings. It is noted that, in the present description and drawings, components having essentially the same steps and elements are denoted by the same reference sign, therefore, repeated explanations for these steps and elements may be omitted.

It is also noted that, the described embodiments are merely some of the embodiments, rather than all of the embodiments of the present disclosure. Reference to "one embodiment" or "an embodiment" throughout the present description means that a particular feature, structure, or characteristic described in connection with the embodiment is included in at least one described embodiment. Therefore, the appearances of the phrase "in one embodiment" or "in an embodiment" in the description are not necessarily all referring to the same embodiment.

Moreover, any particular feature, structure, or characteristic may be combined in one or more embodiments in any suitable manner. It may be appreciated that the present disclosure is not limited to the embodiments described herein. Based on the inventive embodiments described in the present disclosure, all the other embodiments obtained by those skilled in the art without involvement of inventive skills fall within the extent of protection of the present disclosure.

FIG. 1 illustrates a schematic block diagram of an embodiment of an electronic device 100. The electronic device 100 may be any suitable electronic device such as a server, a desktop computer and the like. The electronic device 100 may include a fan 102 used for heat dissipation and a constant-power heat source 104. The fan 102 includes a fan blade that rotates at a rotation speed. The constant-power heat source 104 may be any suitable heat source. As shown in FIG. 1, the electronic device 100 may also include a first temperature sensor 110, a second temperature sensor 120, and a calculation unit 130.

Specifically, the first temperature sensor 110 may sense an ambient temperature and send first information corresponding to the sensed ambient temperature to the calculation unit 130. The first temperature sensor 110 may be any suitable type of temperature sensor. For example, the first temperature sensor 110 may be a contact or a non-contact temperature sensor.

The second temperature sensor 120 may sense a temperature of the constant-power heat source 104 and send second information corresponding to the sensed temperature of the constant-power heat source 104 to the calculation unit 130. The constant-power heat source 104 may generate heat at a constant power, and the constant-power heat source 104 may be affixed near the second temperature sensor 120 in the form of a patch. As such, the second temperature sensor 120 may detect the temperature of the constant-power heat source 104. In one embodiment, the constant-power heat source 104 may be integrated with the second temperature sensor 120 to form a constant-power component capable of automatically outputting its own temperature value.

In some embodiments, locations of the first temperature sensor 110, the second temperature sensor 120, and the constant-power heat source 104 are such that the temperature detected by the first temperature sensor 110 and the temperature detected by the second temperature sensor 120 are related to an ambient temperature and pressure. For example, in one embodiment, the first temperature sensor 110, the second temperature sensor 120, and the constant-power heat source 104 may be located at an air inlet 132 of the fan 102. In another embodiment, the first temperature sensor 110, the second temperature sensor 120, and the constant-power heat source 104 may be located at an air outlet 134 of the fan 102.

The calculation unit 130 may determine an atmospheric pressure at the location of the electronic device 100 based on the ambient temperature detected by the first temperature sensor 110, the temperature of the constant-power heat source 104 sensed by the second temperature sensor 120, and/or a rotation speed of the fan 102. In one embodiment, the rotation speed of the fan 102 may be detected by a fan speed controller 136 of the electronic device 100. As may be appreciated, the fan speed controller 136 may be any suitable type of fan speed controller. Moreover, the rotation speed of the fan 102 may be detected by the fan speed controller 136.

In certain embodiments, the first temperature sensor 110 may detect an ambient temperature $T_1$, and the second temperature sensor 120 may detect a temperature $T_2$ of the constant-power heat source 104. In such embodiments, a temperature difference $\Delta T$ between the temperatures detected by the second and first temperature sensors 110 and 120 may be obtained by calculation. In some embodiments, the rotation speed of the fan 102 may be substantially constant (resulting in volumetric flow rate of air being substantially constant). In such embodiments, in response to the pressure of the environment in which the electronic device 100 is located changing, mass flow rate of air may be changed. As such, the heat dissipation efficiency of the constant-power heat source 104 may be influenced resulting in a temperature difference $\Delta T$ between the temperatures detected by the second temperature sensor 120 and the first temperature sensor 110 changing with the pressure change. In certain embodiments, a functional relation formula using the temperature difference $\Delta T$ between the temperatures detected by the second temperature sensor 120 and the first temperature sensor 110, the rotation speed (e.g., rotations per minute "RPM") of the fan 102, the ambient temperature Ta, and a pressure P may be determined by testing. Such a formula may be: $\Delta T=F(RPM, Ta, P)$. In various embodiments, the atmospheric pressure P may be obtained using the rotation speed RPM of the fan 102, the ambient temperature Ta, and the detected $\Delta T$.

In one embodiment, the calculation unit 130 determines an altitude of the electronic device 100 based on the atmospheric pressure. Specifically, using a relation formula between the atmospheric pressure P and the altitude A (e.g., $P=e^{-(A/7)}$), the calculation unit 130 may obtain the altitude A of the electronic device 100 based on the determined atmospheric pressure P.

Moreover, in some embodiments, the fan speed controller 136 may adjust the rotation speed of the fan 102 based on the ambient temperature and the determined altitude of the electronic device 100.

In various embodiments, a method of controlling a rotation speed of the fan 102 (e.g., a heat dissipation fan) of the electronic device 100 may include: adjusting the rotation speed of the fan 102 based on temperatures of components or modules by using a closed-loop control system; and/or adjusting the rotation speed of the fan 102 based on the ambient temperature by using an open-loop control system.

Figure 2:
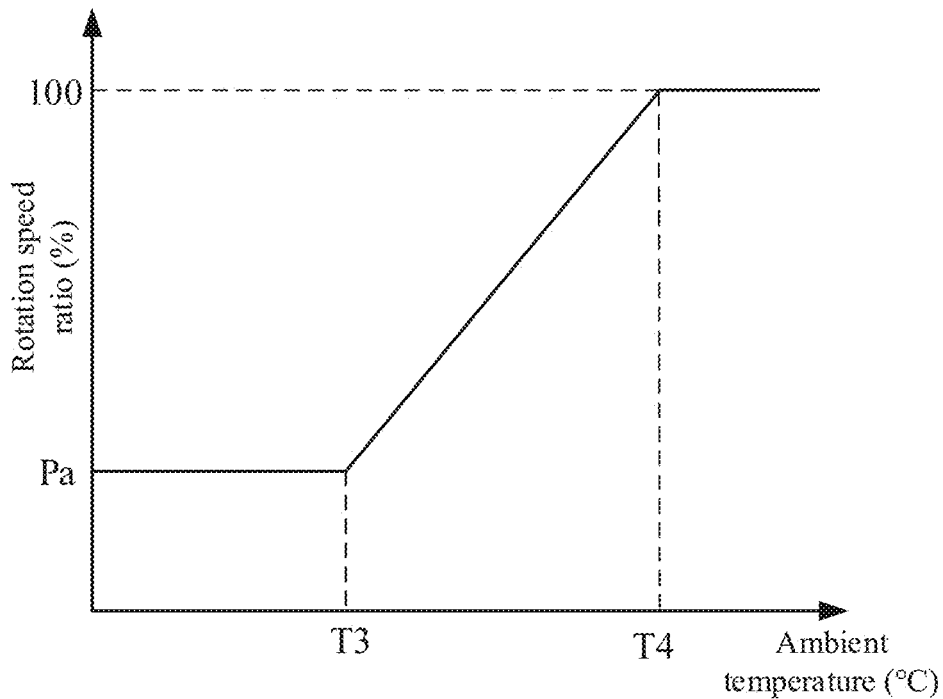
FIG. 2 illustrates an embodiment of a chart of a relationship between a rotation speed ratio of a fan and an ambient temperature.

FIG. 2 illustrates an embodiment of a chart of a relationship between a rotation speed ratio of a fan 102 and an ambient temperature. The rotation speed ratio of the fan 102 may be a ratio by dividing a rotation speed of the fan 102 and a maximum rotation speed of the fan 102. As illustrated, by adjusting the rotation speed of the fan 102, ambient temperature may be changed. In some embodiments, the rotation speed of the fan 102 and the ambient temperature may have a linear relationship. In certain embodiments, Pa represents a lowest rotation speed ratio of the fan 102 after startup, T3 represents an ambient temperature at a beginning of adjusting the fan speed, and T4 represents an ambient temperature at a time in which the rotation speed ratio reaches a maximum.

In some embodiments, a method of controlling the rotation speed of the fan 102 may be used in any suitable system including an electronic device 100, including products in the field of communication network devices, servers, workstations, personal computers and the like, and may be used to control temperatures of a system, a subsystem, and/or thermal reliability of a component that is sensitive to temperature. In various embodiments, if the rotation speed of the fan 102 is adjusted based only on an ambient temperature, with regard to areas of different altitudes, even if the ambient temperature is the same, a difference in atmospheric pressure may lead to different air heat dissipation capabilities. As such, fan speed adjustment logic suitable in low altitude areas may cause the temperature of a component in high altitude areas to exceed specifications, therefore, the pressure change caused by altitude may be considered to more accurately control a rotation speed of the fan 102 and thereby protect a component from excessive temperatures.

In embodiments in which an effect of the ambient temperature and the altitude is considered, the rotation speed RPM of the fan 102 may be a binary function of the ambient temperature and the atmospheric pressure, represented as RPM=f(Ta, P). With the use of a relation formula between the ambient temperature and the altitude, this formula may be translated to a function of the rotation speed ratio and the ambient temperature Ta and the altitude, such as RPM=f (Ta, altitude).

Figure 3:
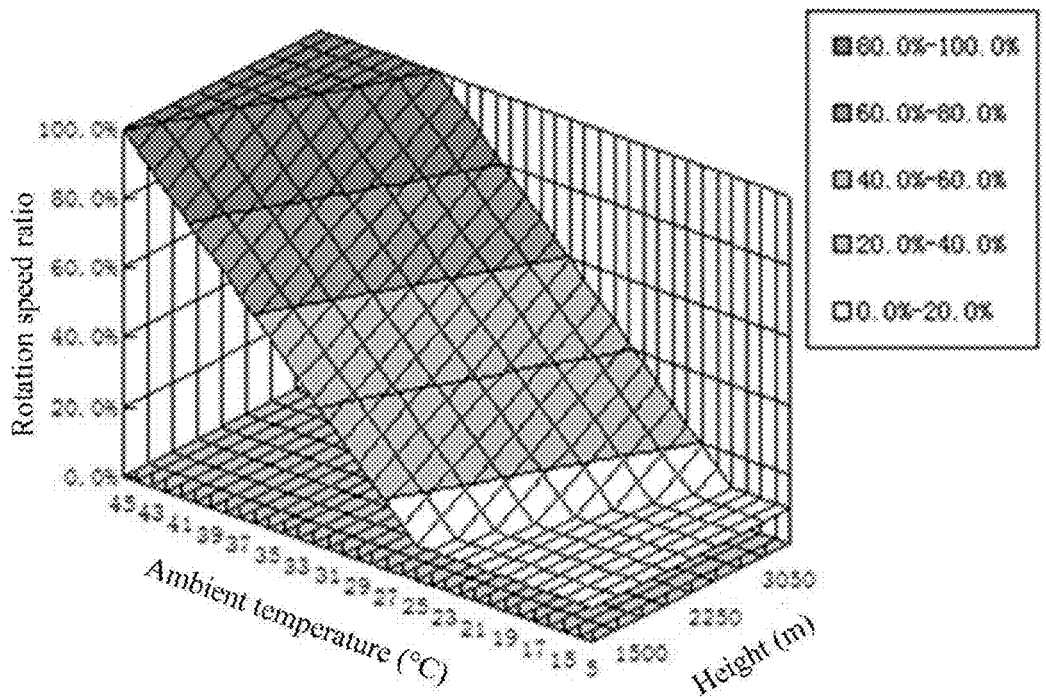
FIG. 3 illustrates an embodiment of a chart of a relationship between a rotation speed ratio of a fan, an ambient temperature, and an altitude.

FIG. 3 illustrates an embodiment of a chart of a relationship between a rotation speed ratio of a fan 102, an ambient temperature, and an altitude. In environments in which the altitude is fixed, the rotation speed ratio of a fan 102 and the ambient temperature are in a linear relationship, as illustrated. In environments in which the ambient temperature is fixed, the rotation speed ratio of a fan 102 and the altitude are in a linear relationship, as illustrated. As such, the fan speed controller 136 may adjust the rotation speed RPM of the fan 102 based on a function of the rotation speed ratio of the fan 102, the ambient temperature Ta, and the altitude, as set forth above. In some embodiments, the fan speed controller 136 may adjust the rotation speed RPM of the fan 102 based on the ambient temperature Ta and the determined altitude of the electronic device 100.

In some embodiments, the electronic device 100 may be an electronic device having a fan 102, for example, a server and the like, and the server may include a first temperature sensor 110, a second temperature sensor 120, and a calculation unit 130. The first temperature sensor 110 may sense an ambient temperature Ta and send first information indicating the sensed ambient temperature to the calculation unit 130. The second temperature sensor 120 may sense a temperature of a constant-power heat source 104 and send second information indicating the sensed temperature of the constant-power heat source 104 to the calculation unit 130.

The first temperature sensor 110, the second temperature sensor 120, and the constant-power heat source 104 may be located at an air inlet 132 of the fan 102. The calculation unit 130 may determine the atmospheric pressure P at the location of the electronic device based on the temperature difference ΔT between the temperatures detected by the second and first temperature sensors 120 and 110, the ambient temperature $T_a$ detected by the first temperature sensor 110, the rotation speed RPM of the fan 102, and a functional relationship ΔT=F(RPM, Ta, P) determined based on testing. Moreover, the calculation unit 130 may determine the current altitude of the electronic device 100 based on a relation formula between the atmospheric pressure and the altitude, as set forth above. A fan speed controller 136 of the electronic device 100 may determine a target fan rotation speed based on the current altitude of the electronic device 100, the ambient temperature $T_a$ detected by the first temperature sensor 110, and the functional relationship between the rotation speed RPM of the fan 102, the ambient temperature, and the atmospheric pressure per the function: RPM=f (Ta, altitude). Furthermore, the fan speed controller 136 may adjust the rotation speed of the fan 102 to the target fan rotation speed.

In various embodiments, the electronic device 100 may facilitate accurate control over the rotation speed of the fan 102 to inhibit degradation of components of the electronic device 102 due to temperature. Furthermore, in some embodiments, the electronic device 100 may use the temperature difference of the temperature sensors to monitor the pressure change without additional altitude sensors, thereby saving manufacturing cost and time. The electronic device 100, as described herein, may be used in a wide range of applications, which may include communication network products, servers, workstations, desktop computers, portable devices, mobile terminals, power supply devices, and the like.

Figure 4:
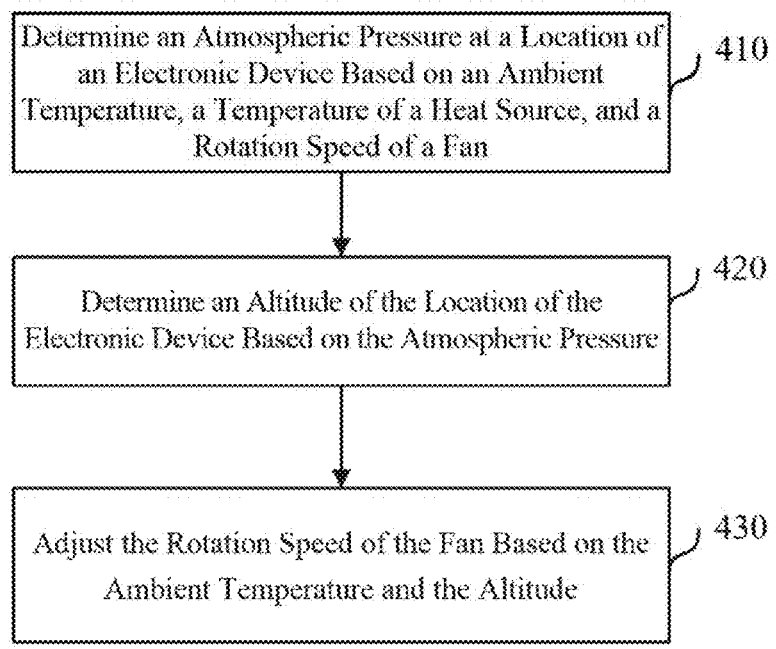
FIG. 4 illustrates a schematic flow chart diagram of an embodiment of a method for determining an atmospheric pressure.

FIG. 4 illustrates a schematic flow chart diagram of an embodiment of a method 400 for determining an atmospheric pressure. The electronic device of method 400 may be substantially similar to the electronic device 100 described above.

In various embodiments, the method 400 includes determining 410 an atmospheric pressure at a location of an electronic device based on an ambient temperature, a temperature of a heat source (e.g., constant-power heat source 104), and a rotation speed of a fan (e.g., fan 102).

In one embodiment, the rotation speed of the fan may be detected by a fan speed controller (e.g., fan speed controller 136). In certain embodiments, the method includes determining 420 an altitude of the location of the electronic device based on the atmospheric pressure. In one embodiment, the method 400 includes adjusting 430 the rotation speed of the fan based on the ambient temperature and the altitude.

In certain embodiments, the method 400 may include: adjusting the rotation speed of the fan based on temperatures of components or modules and using a closed-loop control system; and/or adjusting the rotation speed of the fan based on the ambient temperature and using an open-loop system.

Figure 5:
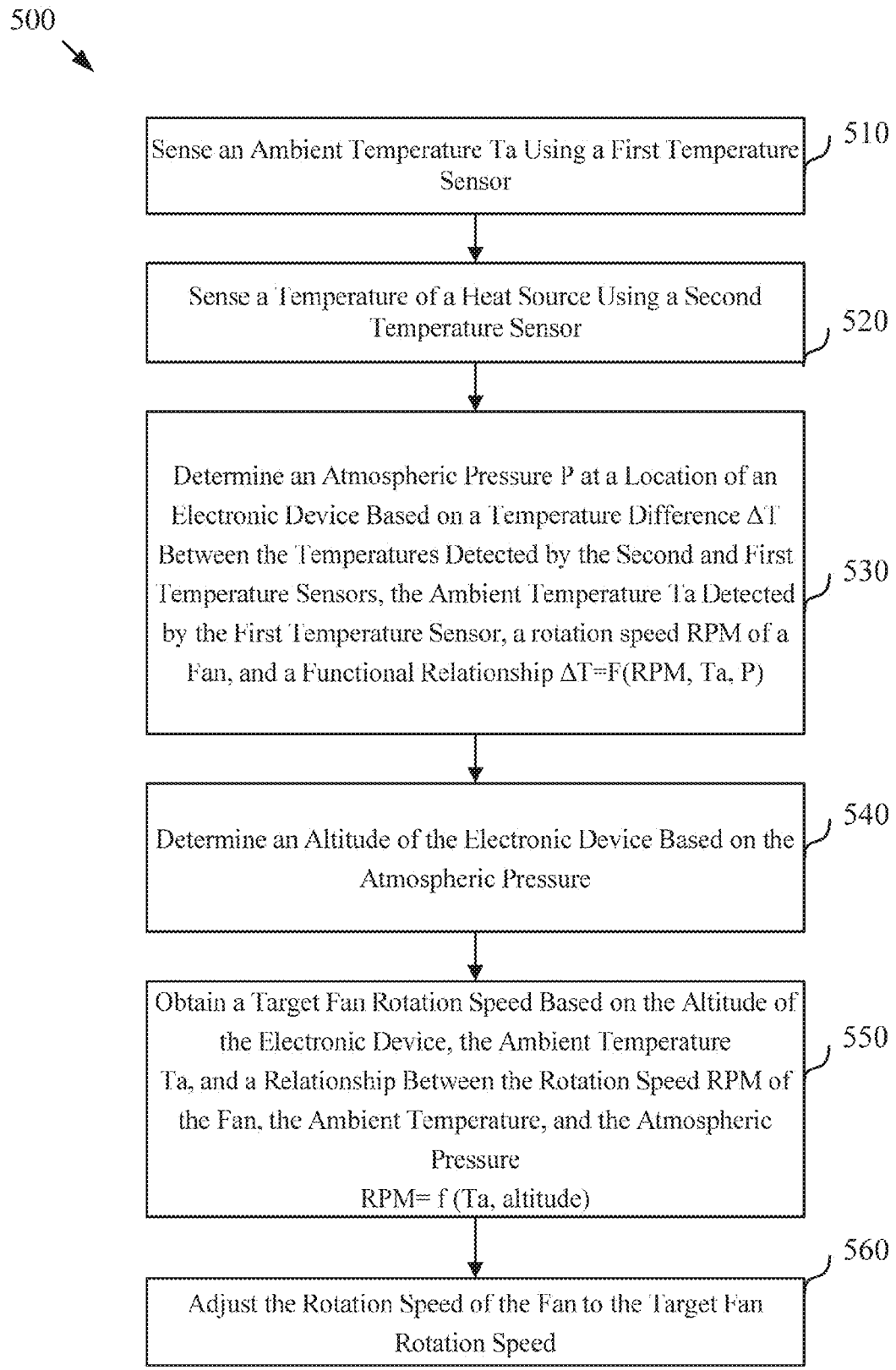
FIG. 5 illustrates a schematic flow chart diagram of another embodiment of a method for determining an atmospheric pressure.

FIG. 5 illustrates a schematic flow chart diagram of another embodiment of a method 500 for determining an atmospheric pressure. The electronic device of method 500 may be substantially similar to the electronic device 100 described above.

In some embodiments, the method 500 includes sensing 510 an ambient temperature Ta using a first temperature sensor (e.g., first temperature sensor 110). In certain embodiments, the method 500 includes sensing 520 a temperature of a heat source (e.g., constant-power heat source 104) using a second temperature sensor (e.g., second temperature 120). In various embodiments, the method 500 includes determining 530 an atmospheric pressure P at a location of the electronic device based on a temperature difference $\Delta T$ between the temperatures detected by the second and first temperature sensors, the ambient temperature $T_a$ detected by the first temperature sensor, a rotation speed RPM of a fan (e.g., fan 102), and a functional relationship as found in the following formula, and determined by testing: $\Delta T = F(RPM, Ta, P)$.

In one embodiment, the method 500 includes determining 540 an altitude of the electronic device based on the atmospheric pressure. For example, the altitude of the electronic device may be determined based on the relation formula between the atmospheric pressure and the altitude set forth above. In some embodiments, the method 500 includes obtaining 550 a target fan rotation speed based on the altitude of the electronic device, the ambient temperature $T_a$, and a functional relationship between the rotation speed RPM of the fan, the ambient temperature, and the atmospheric pressure as found in the following formula: $RPM = f(Ta, altitude)$. In various embodiments, the method 500 includes 560 adjusting the rotation speed of the fan to the target fan rotation speed.

Note that the foregoing embodiments are merely used as examples, the present disclosure is not limited to these examples and can allow various variations.

Note that in the description, the terms "comprises", "comprising" or any other variation thereof are intended to cover a non-exclusive inclusion, such that a process, a method, an article, or a device that comprises a list of elements does not include only those elements, but may include other elements not expressly listed or inherent to such process, method, article, or device. An element defined by the phrase "comprises a . . . " does not, without more constraints, preclude the existence of additional identical elements in the process, method, article, or device that comprises the element.

Finally, also note that the above-mentioned series of processing includes not only the processing performed according to time series in the sequence described herein, but also the processing performed in parallel or respectively rather than according to time series.

Those skilled in the art can understand clearly from the description of the above embodiments that the present disclosure may be realized with the help of software and necessary hardware platforms, and may also be implemented entirely by hardware. Based on this understanding, all or a part of the technical solutions of the present disclosure making contribution to the background may be embodied in the form of a software product which can be stored in a storage medium such as ROM/RAM, diskette or optical disc, and the like, comprising several instructions for one computer device (which can be a personal computer, a server, a network device or the like) to execute the embodiments of the present disclosure or execute the method described by some parts of the embodiments.

The present disclosure has been described above in detail, specific examples are used herein to illustrate the principle and embodiments of the present disclosure, and the descriptions of the above-mentioned embodiments are only for facilitating the understanding of the method of the present disclosure and the core concept thereof; meanwhile, for a person of ordinary skill in the art, changes can be made in the Detailed Description and application range according to the concept of the present disclosure. In conclusion, the contents of the description should not be considered to limit the present disclosure.

What is claimed is:

1. An electronic device comprising:
   a fan, internal to the electronic device, that dissipates heat, wherein the fan rotates at a rotation speed;
   a heat source internal to the electronic device;
   a calculation unit, internal to the electronic device, that determines an atmospheric pressure at a location of the electronic device;
   a first temperature sensor that senses an ambient temperature and sends first information corresponding to the ambient temperature to the calculation unit;
   a second temperature sensor, internal to the electronic device, that senses a temperature of the heat source and sends second information corresponding to the temperature of the heat source to the calculation unit; and
   a fan speed controller, internal to the electronic device, that adjusts the rotation speed of the fan based on the atmospheric pressure;
   wherein the calculation unit determines the atmospheric pressure based on the first information, the second information, and the rotation speed of the fan.

2. The electronic device of claim 1, wherein the first temperature sensor, the second temperature sensor, and the heat source are located at an air inlet of the fan or an air outlet of the fan.

3. The electronic device of claim 1, wherein the calculation unit determines an altitude of the location of the electronic device based on the atmospheric pressure.

4. The electronic device of claim 3, wherein the fan speed controller adjusts the rotation speed of the fan based on the ambient temperature and the altitude.

5. The electronic device of claim 1, wherein the heat source is integrated with the second temperature sensor as a constant-power component that outputs the second information.

6. The electronic device of claim 1, wherein the heat source is a constant-power heat source.

7. The electronic device of claim 1, wherein determining the atmospheric pressure further comprises determining a difference between the ambient temperature and the temperature of the heat source.

8. A method comprising:
   determining an atmospheric pressure at a location of an electronic device, wherein the electronic device comprises a fan internal to the electronic device that dissipates heat and a heat source internal to the electronic device, and the fan rotates at a rotation speed;
   sensing an ambient temperature via a first temperature sensor;
   sensing a temperature of the heat source via a second temperature sensor internal to the electronic device; and
   adjusting the rotation speed of the fan using a fan speed controller internal to the electronic device and based on the atmospheric pressure;
   wherein determining the atmospheric pressure further comprises determining the atmospheric pressure based on the ambient temperature, the temperature of the heat source, and the rotation speed of the fan.

9. The method of claim 8, wherein the first temperature sensor, the second temperature sensor, and the heat source are located at an air inlet of the fan or an air outlet of the fan.

10. The method of claim 8, further comprising determining an altitude of the location of the electronic device based on the atmospheric pressure.

11. The method of claim 10, further comprising adjusting the rotation speed of the fan based on the ambient temperature and the altitude.

12. The method of claim 8, wherein the heat source is integrated with the second temperature sensor as a constant-power component that outputs information indicating the temperature of the heat source.

13. The method of claim 8, wherein the heat source is a constant-power heat source.

14. The method of claim 8, wherein determining the atmospheric pressure further comprises determining a difference between the ambient temperature and the temperature of the heat source.

15. A program product comprising a computer readable storage medium that stores code executable by a processor, the executable code comprising code to perform:
 determining an atmospheric pressure at a location of an electronic device, wherein the electronic device comprises a fan internal to the electronic device that dissipates heat and a heat source internal to the electronic device, and the fan rotates at a rotation speed;
 sensing an ambient temperature via a first temperature sensor;
 sensing a temperature of the heat source via a second temperature sensor internal to the electronic device; and
 adjusting the rotation speed of the fan using a fan speed controller internal to the electronic device and based on the atmospheric pressure;
 wherein determining the atmospheric pressure further comprises determining the atmospheric pressure based on the ambient temperature, the temperature of the heat source, and the rotation speed of the fan.

16. The program product of claim 15, wherein the first temperature sensor, the second temperature sensor, and the heat source are located at an air inlet of the fan or an air outlet of the fan.

17. The program product of claim 15, wherein the executable code further comprises code to determine an altitude of the location of the electronic device based on the atmospheric pressure.

18. The program product of claim 17, wherein the executable code further comprises code to adjust the rotation speed of the fan based on the ambient temperature and the altitude.

19. The program product of claim 15, wherein the heat source is integrated with the second temperature sensor as a constant-power component that outputs information indicating the temperature of the heat source.

20. The program product of claim 15, wherein the heat source is a constant-power heat source.

* * * * *